United States Patent [19]

Takahashi

[11] Patent Number: 4,779,049
[45] Date of Patent: Oct. 18, 1988

[54] MAGNET ASSEMBLY FOR MAGNETIC RESONANCE IMAGING SYSTEM

[75] Inventor: Ryouichi Takahashi, Otawara, Japan

[73] Assignee: Kabushiki Kaisha Toshiba, Kawasaki, Japan

[21] Appl. No.: 82,667

[22] Filed: Aug. 7, 1987

[30] Foreign Application Priority Data

Aug. 20, 1986 [JP] Japan ................... 61-192651

[51] Int. Cl.⁴ .............................................. G01R 33/20
[52] U.S. Cl. .................................... 324/319; 335/299; 336/65
[58] Field of Search ........................ 324/318, 319, 320; 335/216, 299; 336/65, 115, 129

[56] References Cited

U.S. PATENT DOCUMENTS

| | | | |
|---|---|---|---|
| 4,560,933 | 12/1985 | Forster et al. | 324/319 |
| 4,571,568 | 2/1986 | Grangereau | 335/299 |
| 4,580,098 | 4/1986 | Gluckstern et al. | 324/318 |
| 4,591,790 | 5/1986 | Takahashi | 324/318 |
| 4,660,013 | 4/1987 | Laskaris et al. | 335/299 |
| 4,727,327 | 2/1988 | Toyoshima et al. | 324/318 |

FOREIGN PATENT DOCUMENTS 60-98343 6/1985 Japan.
60-98344 6/1985 Japan.

*Primary Examiner*—Stewart J. Levy
*Assistant Examiner*—Kevin D. O'Shea
*Attorney, Agent, or Firm*—Foley & Lardner, Schwartz, Jeffery, Schwaab, Mack, Blumenthal & Evans

[57] ABSTRACT

A magnet assembly for use in a magnetic resonance imaging system includes an outer cylindrical casing composed of a plurality of axially separate, connectable cylinder blocks, a plurality of air core coils arrayed in each of the cylinder blocks for generating a static magnetic field, a plurality of bases supporting each of the cylinder blocks, two discs attached respectively to axially opposite ends of the outer cylindrical casing, a plurality of three-dimensional adjustment bolts mechanisms disposed in the cylinder blocks and on the discs and having bolts hend endwise against the air core coils for positionally adjusting the coils independently in three directions with respect to axes of the cylinder blocks, and a plurality of connectors interconnecting the cylinder blocks into the outer cylindrical casing.

14 Claims, 6 Drawing Sheets

4,779,049

MAGNET ASSEMBLY FOR MAGNETIC RESONANCE IMAGING SYSTEM

BACKGROUND OF THE INVENTION

The present invention relates to a magnet assembly for use in a magnetic resonance imaging system used in medical diagnosis applications.

As shown in FIG. 8 of the accompanying drawings, an MRI (magnetic resonance imaging system) has four ring-shaped magnets M defining a projection region space centrally therein and spaced at axial intervals. The magnets M serve to produe a uniform static magnetic field in the projection region space in which a portion (such as the head, for exampe), to be imaged, of a human body P on a bed is placed. The MRI system also has two curved high-frequency coils HC disposed around the portion to be imaged. High-frequency pulses are applied to the high-frequency coils HC to enable the same to generate an MR signal which will be detected by the same high-frequency coils HC. Each of the magnets M comprises a winding or coil in the form of an air core coil.

The static magnetic field is required to be intensive enough to produce mangnetic resonance and also to keep the projection region space uniform. Since the conventional magnet assembly is large in size and heavy, it cannot be transported and installed while it is in the assembled condition (i.e., capable of operation). Therefore, the magnet assembly is carried to the installation site while it is in the disassembled condition. At the installation site, the magnet assembly is put together, and the air core coils for generating the static magnetic field are positionally adjusted in X-, Y-, and Z-axis directions with respect to the axis of an outer cylindrical casing in which the coils are to be housed.

Inasmuch as the outer cylindrical casing is constructed as a single body, the process of attaching the coils to the outer cylindrical casing and the process of accurately positinally adjusting the coils in the above three directions, procedures which greatly affect the requirements to be met by the static magnetic field, must be carried out at the time of installing the magnet assembly. The assembling process is complex because the number of required parts is large and the structure is complicated. Furthermore, it is difficult to reassume the coil positions prior to the disassembling of the magnet assembly.

SUMMARY OF THE INVENTION

In view of the aforesaid problems of the conventional magnet assembly, it is an object of the present invention to provide a magnet assembly for use in an MRI system, which includes coils that can be disassembled and assembled while they are being held in prescribed positions, and which is constructed of a small number of parts and can be manufactured highly efficiently.

According to the present invention, a magnet assembly for use in a magnetic resonance imaging system includes an outer cylindrical casing composed of a plurality of axially separate, connectable cylinder blocks, a plurality of air core coils arrayed in each of the cylinder blocks for generating a static magnetic field, a plurality of bases supporting each of the cylinder blocks, two discs attached respectively to axially opposite ends of the outer cylindrical casing, a plurality of three-dimensional adjustment bolts mechanisms disposed in the cylinder blocks and on the discs and having bolts hend endwise against the air core coils for positionally adjusting the coils independently in three directions with respect to axes of the cylinder blocks, and a plurality of connectors interconnecting the cylinder blocks into the outer cylindrical casing.

The outer cylindrical casing is dividable into the cylinder blocks with the respective coils housed therein, and each of the cylinder blocks houses the mechanisms for positionally adjusting the coils. Therefore, the magnet assembly can easily be disassembly, carried, installed, and assembled again with accuracy and ease.

The above and other objects, features and advantages of the present invention will become more apparent from the following description when taken in conjunction with the accompanying drawings in which preferred embodiments of the present invention are shown by way of illustrative example.

DESCRIPTION OF THE PREFERRED EMBODIMENTS

Figure 1:
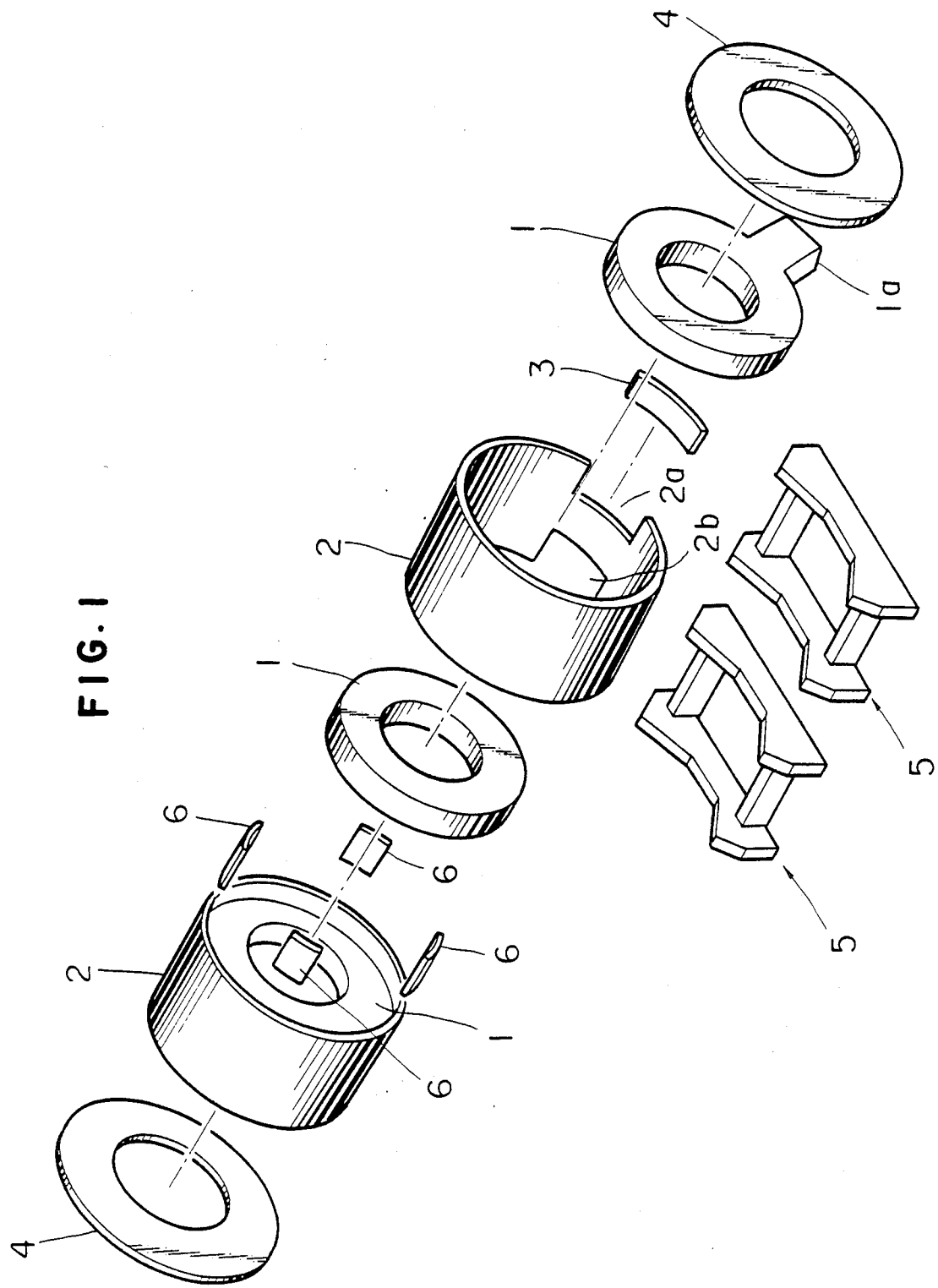
FIG. 1 is an exploded perspective view of a magnet assembly for use in an MRI system according to the present invention.
Figure 2:
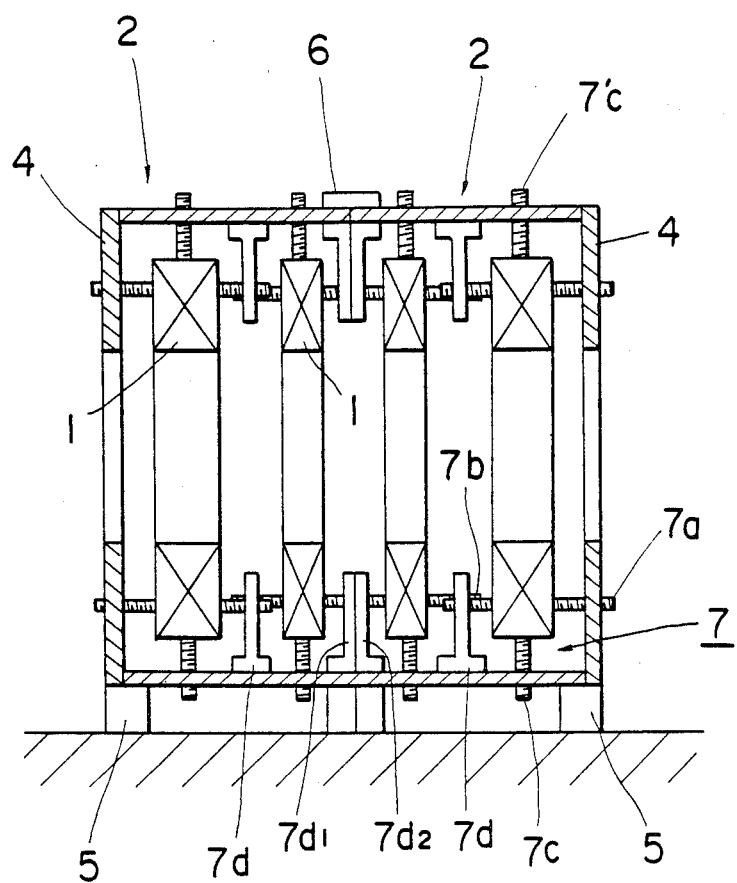
FIG. 2 is a longitudinal cross-sectional view of the magnet assembly.
Figure 3:
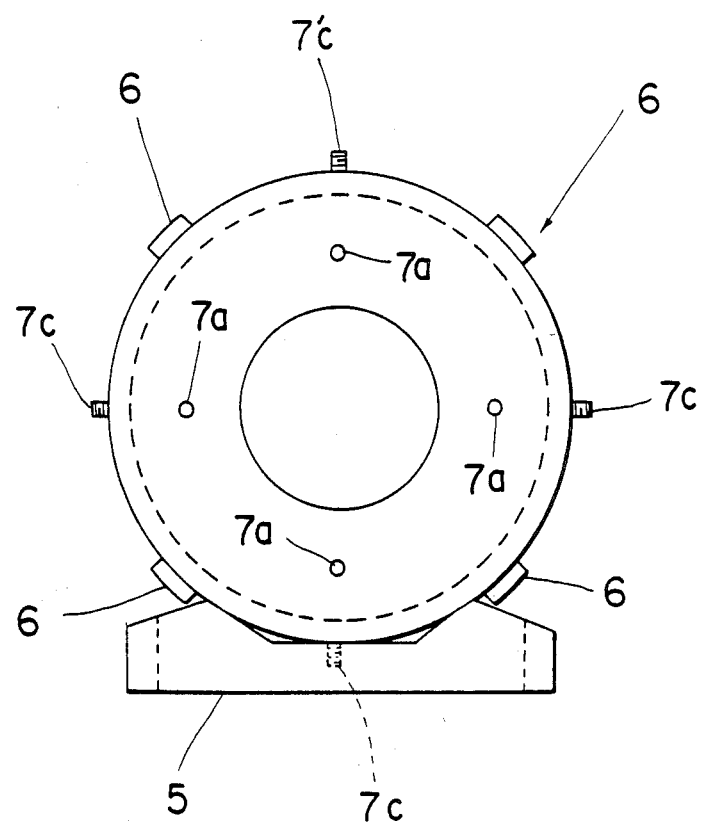
FIG. 3 is a front elevational view of the magnet assembly.

FIGS. 1 through 3 illustrate a magnet assembly for use in an MRI system according to an embodiment of the present invention.

The magnet assembly comprises fourth air core coils 1 having central hollow spaces for generating a static magnetic field therein. Each of the coils 1 has an radially outwardly extending arm 1a comprising electric connector means (not shown) and a pipe coupling (not shown) for supplying cooling water. The coils 1 are housed in an outer cylindrical casing comprising two axially aligned cylinder blocks 2.

Each of the cylinder blocks 2 has a pair of peripheral slots 2a, 2b defined in opposite peripheral edges, respectively, of the cylinder block 2 for avoiding mechanical interference with the arms 1a when two air core coils 1 are inserted into each cylinder block 2. The cylinder blocks 2 are interconnected in the manner described later.

Slot covers 3 are detachably attached to the outer peripheral surface of each cylinder block 2 by suitable coupling means, the slot covers 3 being positioned to cover the slots 2a, 2b, respectively. When the cylinder blocks 2 are coupled to each other, ring-shaped discs 4 are fixed respectively to the opposite open ends of the outer cylindrical casing. Bases 5 are disposed below and in contact with the outer peripheral surfaces of the cylinder blocks 2, respectively. The cylinder blocks 2 are interconnected into the outer cylindrical casing by four connectors 6 (described later on) which are positioned on the outer peripheral surfaces of the cylinder blocks 2 at equally circumferentially spaced locations.

Three-dimensional adjustment bolt mechanisms 7 positionally adjust the air core coils 1 in each of the cylinder blocks 2 independently in three (X-, Y-, and Z-axis) directions with respect to the axis of the cylinder block. There are four adjustment bolt mechanisms 7 for each coil 1 which are disposed at equally circumferentially spaced positions around the coil 1.

As shown in FIGS. 2 and 3, each of the adjustment bolt mechanisms 7 comprises three bolts 7a, 7b, 7c having heads held against the axial end and peripheral surfaces of the coil 1 and a bracket 7d by which the bolt 7b is threadedly supported. The two bolts 7a, 7b which contact the axial end faces of the coil 1 are pushed and pulled or vice versa by means of a tool (not shown) for positionally adjusting the coil 1 along the axis of the cylinder block 2. The other bolt 7c held against the peripheral surface of the coil 1 is pushed when the corresponding bolt 7'c of the diametrically opposite adjustment bolt mechanism 7 is pulled, and vice versa, for positionally adjusting the coil 1 in the radial direction. The bolts 7a, 7c which are not supported by the bracket 7d are threadedly supported respectively by the disc 4 and the outer peripheral wall of the cylinder block 2. The disc 4 which supports the bolt 7a also serves as a magnetic shield plate.

Figure 4A:
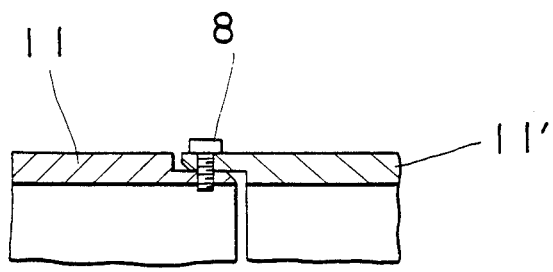
FIG. 4a is a fragmentary cross-sectional view of a structure by which cylinder blocks are coupled.
Figure 4B:
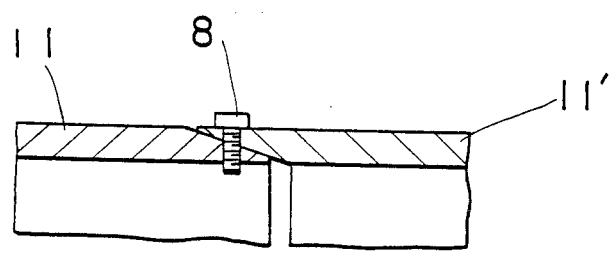
FIG. 4b is a fragmentary cross-sectional view of another structure by which cylinder blocks are coupled.
Figure 4C:
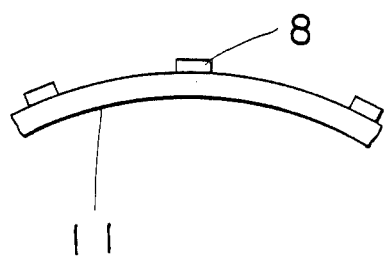
FIG. 4c is a fragmentary side elevational view of the arrangements shown in FIGS. 4a and 4b.

FIGS. 4a through 4c show different structures by which the cylinder blocks 2 are interconnected. In FIG. 4a, a righthand peripheral end of a lefthand cylinder block 11 is of a smaller diameter, and a lefthand peripheral end of a righthand cylinder block 11' is of a larger diameter. The smaller-diameter end of the cylinder block 11 is fitted in the larger-diameter end of the cylinder block 11', and the interfitted ends are coupled to each other by a plurality of connector bolts 8. FIG. 4b shows cylinder blocks 11, 11' with their complementarily tapered peripheral ends beine interfitted and coupled to each other by means of a plurality of connector bolts 8. FIG. 4c shows each of the arrangements of FIGS. 4a and 4b in side elevation.

Figure 5A:
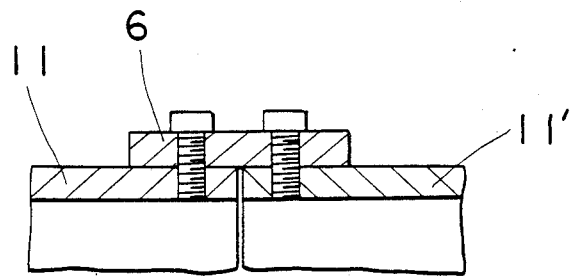
FIG. 5a is a fragmentary cross-sectional view of a connector.
Figure 5B:
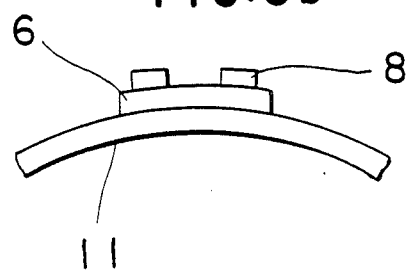
FIG. 5b is a fragmentary side elevational view of the connector.
Figure 6:
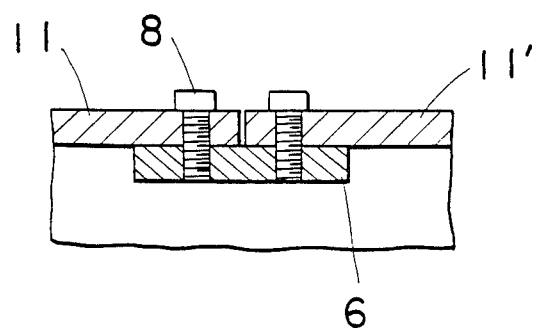
FIG. 6 is a a fragmentary cross-sectional view of another connector.

FIGS. 5a, 5b, and 6 illustrate different connectors which interconnect paired cylinder blocks. As shown in FIGS. 5a and 5b, a connector 6 is disposed on the outer peripheral surfaces of cylinder blocks 11, 11' across their joining ends. FIG. 6 shows a connector 6 disposed on the inner peripheral surfaces of cylinder blocks 11, 11' across their joining ends.

As shown in FIG. 2, the brackets 7 are T-shaped and disposed on the inner peripheral surfaces of the cylinder blocks 2 for securely supporting the bolts. However, brackets 7d1, 7d2 at the joining ends of the cylinder blocks 2 are L-shaped and inverted L-shaped configurations, so that the axial distance between two adjacent coils 1 at the inner ends of the cylinder blocks 2 is minimized.

The cylinder blocks 2 are made of iron, and the discs 4, the bases 5, and the connectors 6 are preferably made of a nonmagnetic material.

Another embodiment of the present invention will be described with reference to FIG. 7.

Figure 7:
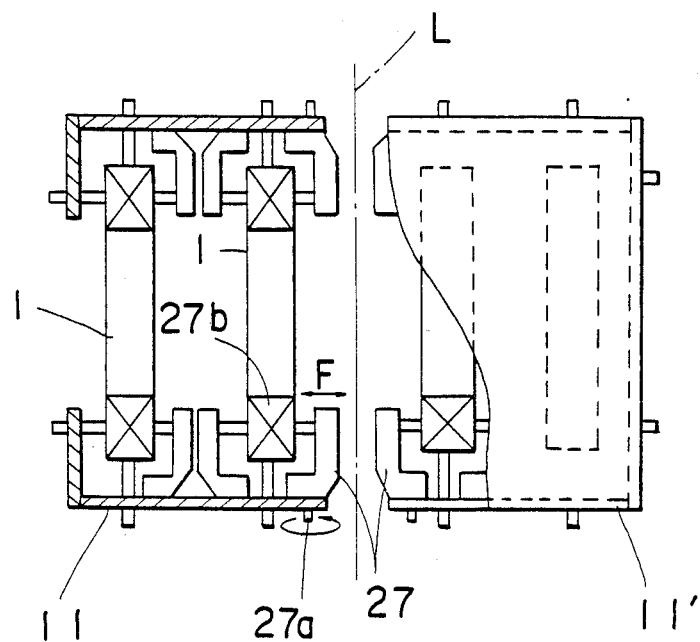
FIG. 7 is a partly cross-sectional view of a magnet assembly according to another embodiment of the present invention.
Figure 8:
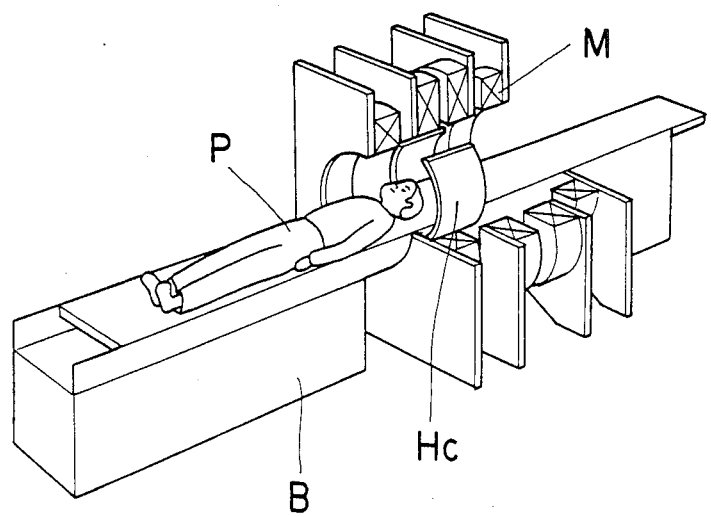
FIG. 8 is a perspective view, partly cut away, of an MRI system.

As shown in FIG. 7, the coils 1 are positionally adjustable in three directions by means of coil support units 27 each having a gear mechanism for converting rotary motion of an external input shaft 27a to linear motion of a support rod 27b in the direction of the arrow F thereby to fasten or loosen the coil 1.

When the magnet assembly is to be transported, the connector bolts 8 are removed from the connectors 6 to divide the outer cylindrical casing into the cylinder blocks 2, which can then be carried while the coils 1 are being accommodated in the cylinder blocks 2 and while the adjustment bolt mechanisms 7 are kept in their adjusted positions with respect to the coils 1. At an installation site, the cylinder blocks 2 can be put together into an MRI system.

Therefore, the coils 1 can be attached to the outer cylindrical casing and positionally adjusted in three directions highly accurately and easily. Since the mechanisms and parts in each of the cylinder blocks 2 do not need to be disassembled for shipment, any components which would otherwise be required for disassembly are not necessary, and the number of parts to be manufatured and the number of parts to be handled upon installation are reduced.

The number of cylinder blocks used may suitably be selected, and various structures and arrangements may be employed for the three-dimensional adjustment bolt mecahnisms and connectors.

Although certain preferred embodiments have been shown and described, it should be understood that many changes and modifications may be made therein without departing from the scope of the appended claims.

What is claimed is:

1. A magnet assembly for use in a magnetic resonance imaging system, comprising:
   an outer cylindrical casing composed of a plurality of axially separate, connectable cylinder blocks;
   a plurality of air core coils arrayed in each of said cylinder blocks for generating a static magnetic field;
   a plurality of bases supporting each of said cylinder blocks;
   two discs attached respectively to axially opposite ends of said outer cylindrical casing;
   a plurality of three-dimensional adjustment bolts mechanisms disposed in said cylinder blocks and on said discs and having bolts hend endwise against said air core coils for positionally adjusting said coils independently in three directions with respect to axes of said cylinder blocks; and
   a plurality of connectors interconnecting said cylinder blocks into said outer cylindrical casing.

2. A magnet assembly according to claim 1, wherein said connectors are disposed on outer peripheral surfaces of said cylinder blocks.

3. A magnet assembly according to claim 1, wherein said connectors are disposed on inner peripheral surfaces of said cylinder blocks.

4. A magnet assembly according to claim 1, wherein said cylinder blocks have opposite ends of different diameters disposed in interfitting relation to each other.

5. A magnet assembly according to claim 1, wherein said cylinder blocks have tapered opposite ends disposed in interfitting relation to each other.

6. A magnet assembly according to claim 1, wherein said three-dimensional adjustment bolt mechanisms include L-shaped brckets for minimizing the distance between two coils positioned respectively at joining ends of said cylinder blocks.

7. A magnet assembly according to claim 2, wherein said cylinder blocks have opposite ends of different diameters disposed in interfitting relation to each other.

8. A magnet assembly according to claim 3, wherein said cylinder blocks have opposite ends of different diameters disposed in interfitting relation to each other.

9. A magnet assembly according to claim 2, wherein said cylinder blocks have tapered opposite ends disposed in interfitting relation to each other.

10. A magnet assembly according to claim 3, wherein said cylinder blocks have tapered opposite ends disposed in interfitting relation to each other.

11. A magnet assembly according to claim 2, wherein said three-dimensional adjustment bolt mechanisms include L-shaped brackets for minimizing the distance between two coils positioned respectively at joining ends of said cylinder blocks.

12. A magnet assembly according to claim 3, wherein said three-dimensional adjustment bolt mechanisms include L-shaped brackets for minimizing the distance between two coils positioned respectively at joining ends of said cylinder blocks.

13. A magnet assembly according to claim 4, wherein said three-dimensional adjustment blot mechanisms include L-shaped brackets for minimizing the distance between two coils positioned respectively at joining ends of said cylinder blocks.

14. A magnet assembly according to claim 5, wherein said three-dimensional adjustment bolt mechanisms include L-shaped brackets for minimizing the distance between two coils positioned respectively at joining ends of said cylinder blocks.

* * * * *